(12) United States Patent
Doerr

(10) Patent No.: US 11,892,690 B1
(45) Date of Patent: Feb. 6, 2024

(54) OPTOELECTRONIC BALL GRID ARRAY PACKAGE WITH FIBER

(71) Applicant: Acacia Communications, Inc., Maynard, MA (US)

(72) Inventor: Christopher Doerr, Middleton, NJ (US)

(73) Assignee: ACACIA COMMUNICATIONS, INC., Maynard, MA (US)

( * ) Notice: Subject to any disclaimer, the term of this patent is extended or adjusted under 35 U.S.C. 154(b) by 0 days.

(21) Appl. No.: 17/832,140

(22) Filed: Jun. 3, 2022

Related U.S. Application Data

(62) Division of application No. 14/927,016, filed on Oct. 29, 2015, now Pat. No. 11,360,278.

(Continued)

(51) Int. Cl.
*G02B 6/42* (2006.01)
*G02B 6/30* (2006.01)
(Continued)

(52) U.S. Cl.
CPC ............... *G02B 6/423* (2013.01); *G02B 6/30* (2013.01); *G02B 6/3616* (2013.01); *G02B 6/428* (2013.01); *G02B 6/4272* (2013.01); *G02B 6/4202* (2013.01); *G02B 6/4204* (2013.01); *G02B 6/424* (2013.01); *G02B 6/4232* (2013.01); *G02B 6/4245* (2013.01); *G02B 6/4249* (2013.01); *G02B 6/4267* (2013.01); *G02B 6/4269* (2013.01); *G02B 6/4273* (2013.01); *G02B 6/4457* (2013.01); *H01L 2224/16225* (2013.01); *H01L 2224/73253* (2013.01)

(58) Field of Classification Search
CPC ........ G02B 6/423; G02B 6/30; G02B 6/3616; G02B 6/4272; G02B 6/428; G02B 6/4202; G02B 6/4232; G02B 6/424; G02B 6/4245; G02B 6/4249; G02B 6/4267; G02B 6/4269; G02B 6/42273; G02B 6/4457; H01L 2224/16225; H01L 2224/73253
See application file for complete search history.

(56) References Cited

U.S. PATENT DOCUMENTS

| 4,456,334 A | 6/1984 | Henry et al. |
| 4,776,661 A | 10/1988 | Handa |

(Continued)

FOREIGN PATENT DOCUMENTS

| GB | WO02075379 | 9/2002 |
| GB | WO02075379 | 2/2003 |

(Continued)

OTHER PUBLICATIONS

International Preliminary Report on Patentability dated May 11, 2017 for Application No. PCT/US2015/058070.

(Continued)

*Primary Examiner* — Peter Radkowski
(74) *Attorney, Agent, or Firm* — K&L GATES LLP

(57) ABSTRACT

A photonic integrated circuit may be coupled to an optical fiber and packaged. The optical fiber may be supported by a fiber holder during a solder reflow process performed to mount the packaged photonic integrated circuit to a circuit board or other substrate. The optical fiber may be decoupled from the fiber holder, and the fiber holder removed, after completion of the solder reflow process.

12 Claims, 7 Drawing Sheets

Related U.S. Application Data

(60) Provisional application No. 62/069,877, filed on Oct. 29, 2014.

(51) Int. Cl.
*G02B 6/36* (2006.01)
*G02B 6/44* (2006.01)

(56) References Cited

U.S. PATENT DOCUMENTS

| | | | |
|---|---|---|---|
| 4,826,272 A | 5/1989 | Pimpinella et al. | |
| 4,869,568 A | 9/1989 | Schimpe | |
| 5,146,518 A | 9/1992 | Mak et al. | |
| 5,208,800 A | 5/1993 | Isobe et al. | |
| 5,420,947 A | 5/1995 | Li et al. | |
| 5,469,526 A | 11/1995 | Rawlings | |
| 5,515,200 A | 5/1996 | Delrosso et al. | |
| 5,581,642 A | 12/1996 | Deacon et al. | |
| 5,646,775 A | 7/1997 | Delrosso et al. | |
| 5,659,641 A | 8/1997 | DeMeritt et al. | |
| 5,664,032 A | 9/1997 | Bischel et al. | |
| 5,778,132 A * | 7/1998 | Csipkes | H01S 3/06704 |
| | | | 359/341.1 |
| 5,790,730 A | 8/1998 | Kravitz et al. | |
| 5,898,812 A | 4/1999 | Vanoli | |
| 5,915,061 A | 6/1999 | Vanoli | |
| 5,943,461 A | 8/1999 | Shahid | |
| 6,058,235 A | 5/2000 | Hiramatsu et al. | |
| 6,072,931 A | 6/2000 | Yoon et al. | |
| 6,132,104 A * | 10/2000 | Bliss | H01S 3/06704 |
| | | | 385/53 |
| 6,144,792 A | 11/2000 | Kim et al. | |
| 6,198,860 B1 | 3/2001 | Johnson et al. | |
| 6,224,268 B1 | 5/2001 | Manning et al. | |
| 6,259,841 B1 | 7/2001 | Bhagavatula | |
| 6,263,143 B1 | 7/2001 | Potteiger et al. | |
| 6,310,991 B1 | 10/2001 | Koops et al. | |
| 6,320,257 B1 | 11/2001 | Jayaraj et al. | |
| 6,334,020 B1 * | 12/2001 | Fujimori | G02B 6/4453 |
| | | | 385/134 |
| 6,445,939 B1 | 9/2002 | Swanson et al. | |
| 6,459,842 B1 | 10/2002 | Arsenault et al. | |
| 6,477,297 B1 | 11/2002 | DeMeritt et al. | |
| 6,503,336 B1 | 1/2003 | Barr | |
| 6,522,459 B1 | 2/2003 | Pease et al. | |
| 6,542,682 B2 | 4/2003 | Cotteverte et al. | |
| 6,546,180 B1 | 4/2003 | Koyano et al. | |
| 6,567,600 B2 | 5/2003 | Yoshida | |
| 6,567,963 B1 | 5/2003 | Trezza | |
| 6,601,998 B2 | 8/2003 | Arsenault et al. | |
| 6,631,027 B2 | 10/2003 | Gerrish et al. | |
| 6,640,034 B1 | 10/2003 | Charlton et al. | |
| RE38,310 E | 11/2003 | DeMerritt et al. | |
| 6,690,845 B1 | 2/2004 | Yoshimura et al. | |
| 6,788,834 B2 | 9/2004 | Pokrovski et al. | |
| 6,811,326 B2 | 11/2004 | Keeble et al. | |
| 6,822,465 B1 | 11/2004 | Babcock et al. | |
| 6,836,355 B2 | 12/2004 | Lelic et al. | |
| 6,932,520 B2 * | 8/2005 | Tai | G02B 6/4215 |
| | | | 385/47 |
| 6,945,712 B1 | 9/2005 | Conn | |
| 6,976,795 B2 | 12/2005 | Go et al. | |
| 7,006,732 B2 | 2/2006 | Gunn et al. | |
| 7,058,247 B2 | 6/2006 | Crow et al. | |
| 7,065,272 B2 | 6/2006 | Taillaert et al. | |
| 7,118,294 B2 | 10/2006 | Hamasaki et al. | |
| 7,233,712 B2 | 6/2007 | Arellano | |
| 7,239,783 B2 * | 7/2007 | Yamamoto | G02B 6/29377 |
| | | | 385/127 |
| 7,298,945 B2 | 11/2007 | Gunn, III et al. | |
| 7,327,022 B2 | 2/2008 | Claydon et al. | |
| 7,362,934 B2 | 4/2008 | Hamano | |
| 7,473,038 B2 | 1/2009 | Fujiwara et al. | |
| 7,782,911 B2 | 8/2010 | Munroe et al. | |
| 7,785,020 B2 | 8/2010 | Kim et al. | |
| 7,835,069 B2 | 11/2010 | Hamada | |
| 7,957,623 B2 | 6/2011 | Panarello et al. | |
| 8,021,057 B2 | 9/2011 | Tamura et al. | |
| 8,058,137 B1 | 11/2011 | Or-Bach et al. | |
| 8,064,739 B2 | 11/2011 | Binkert et al. | |
| 8,168,939 B2 * | 5/2012 | Mack | G02B 6/43 |
| | | | 250/225 |
| 8,290,008 B2 | 10/2012 | Andry et al. | |
| 8,493,651 B1 | 7/2013 | Hu et al. | |
| 8,550,724 B2 | 10/2013 | Oki | |
| 8,582,975 B2 * | 11/2013 | Nagarajan | H04J 14/0282 |
| | | | 398/79 |
| 8,654,440 B2 | 2/2014 | Nakagawa | |
| 8,655,183 B2 | 2/2014 | Ho et al. | |
| 8,821,039 B2 | 9/2014 | Matsui et al. | |
| 8,824,837 B2 | 9/2014 | Ren et al. | |
| 8,867,869 B2 * | 10/2014 | Steijer | G02B 6/4259 |
| | | | 257/E31.127 |
| 9,557,478 B2 | 1/2017 | Doerr et al. | |
| 9,917,412 B1 * | 3/2018 | Piciaccia | H01S 3/1608 |
| 11,128,384 B2 * | 9/2021 | Wang | H01S 3/06754 |
| 2002/0028045 A1 | 3/2002 | Yoshimura | |
| 2002/0081087 A1 | 6/2002 | Chen et al. | |
| 2002/0093729 A1 | 7/2002 | Gerish et al. | |
| 2002/0136506 A1 | 9/2002 | Asada et al. | |
| 2002/0168147 A1 | 11/2002 | Case et al. | |
| 2003/0016440 A1 * | 1/2003 | Zeidan | H01S 3/06704 |
| | | | 359/341.1 |
| 2003/0044127 A1 | 3/2003 | Roth et al. | |
| 2003/0103755 A1 | 6/2003 | Meyer | |
| 2003/0117770 A1 | 6/2003 | Montgomery et al. | |
| 2003/0133686 A1 | 7/2003 | Delrosso et al. | |
| 2003/0142938 A1 | 7/2003 | Koyano et al. | |
| 2003/0185525 A1 | 10/2003 | Lacy et al. | |
| 2003/0189214 A1 | 10/2003 | Nguyen et al. | |
| 2003/0223683 A1 | 12/2003 | Bennett et al. | |
| 2004/0005130 A1 * | 1/2004 | Yamamoto | G02B 6/29377 |
| | | | 385/123 |
| 2004/0036170 A1 | 2/2004 | Lee et al. | |
| 2004/0048417 A1 | 3/2004 | Nguyen et al. | |
| 2004/0066551 A1 | 4/2004 | Lelic et al. | |
| 2004/0076380 A1 | 4/2004 | Asada et al. | |
| 2004/0101020 A1 | 5/2004 | Bhandarkar | |
| 2004/0151444 A1 * | 8/2004 | Tai | G02B 6/4204 |
| | | | 385/47 |
| 2004/0175092 A1 | 9/2004 | Young et al. | |
| 2005/0018950 A1 | 1/2005 | Arellano | |
| 2005/0093013 A1 | 5/2005 | Mastromatteo et al. | |
| 2005/0100294 A1 | 5/2005 | Nguyen et al. | |
| 2005/0117835 A1 | 6/2005 | Nguyen et al. | |
| 2005/0175294 A1 | 8/2005 | Kuu | |
| 2005/0224946 A1 | 10/2005 | Dutta | |
| 2005/0230795 A1 | 10/2005 | Furuyama et al. | |
| 2006/0215963 A1 | 9/2006 | Hamano | |
| 2006/0222303 A1 | 10/2006 | Chung et al. | |
| 2006/0280410 A1 | 12/2006 | Fujiwara et al. | |
| 2007/0031100 A1 | 2/2007 | Garcia et al. | |
| 2007/0036335 A1 | 2/2007 | Skradde et al. | |
| 2007/0241783 A1 | 10/2007 | Schmit et al. | |
| 2008/0062980 A1 | 3/2008 | Sunaga et al. | |
| 2008/0198880 A1 | 8/2008 | Munroe et al. | |
| 2008/0226228 A1 | 9/2008 | Tamura et al. | |
| 2008/0239468 A1 | 10/2008 | Hamada | |
| 2008/0247713 A1 | 10/2008 | Tamura et al. | |
| 2009/0010600 A1 | 1/2009 | Kim et al. | |
| 2009/0296746 A1 | 12/2009 | Heaton et al. | |
| 2010/0006784 A1 * | 1/2010 | Mack | G02B 6/43 |
| | | | 250/551 |
| 2010/0059822 A1 | 3/2010 | Pinguet et al. | |
| 2010/0074586 A1 | 3/2010 | Panarello et al. | |
| 2010/0215317 A1 | 8/2010 | Rolston et al. | |
| 2011/0044369 A1 | 2/2011 | Andry et al. | |
| 2011/0058813 A1 | 3/2011 | Boyd et al. | |
| 2011/0158658 A1 | 6/2011 | Myslinski et al. | |
| 2012/0014639 A1 | 1/2012 | Doany et al. | |
| 2012/0057874 A1 * | 3/2012 | Nagarajan | H04J 14/025 |
| | | | 398/79 |

(56) References Cited

U.S. PATENT DOCUMENTS

| | | | |
|---|---|---|---|
| 2012/0063718 A1* | 3/2012 | Steijer | G02B 6/4269 385/14 |
| 2012/0129301 A1 | 5/2012 | Or-Bach et al. | |
| 2012/0170927 A1 | 7/2012 | Huang et al. | |
| 2012/0177381 A1 | 7/2012 | Dobbelaere et al. | |
| 2012/0183256 A1 | 7/2012 | Shao et al. | |
| 2012/0205524 A1 | 8/2012 | Mack et al. | |
| 2012/0237171 A1 | 9/2012 | Oki | |
| 2012/0326290 A1 | 12/2012 | Andry et al. | |
| 2013/0155642 A1 | 6/2013 | McColloch | |
| 2013/0182996 A1 | 7/2013 | Shastri et al. | |
| 2013/0230272 A1 | 9/2013 | Raj et al. | |
| 2013/0266277 A1 | 10/2013 | Otte | |
| 2013/0308898 A1 | 11/2013 | Doerr et al. | |
| 2013/0336617 A1 | 12/2013 | Otte et al. | |
| 2014/0010498 A1 | 1/2014 | Verslegers et al. | |
| 2014/0064659 A1 | 3/2014 | Doerr et al. | |
| 2014/0099061 A1 | 4/2014 | Isenhour et al. | |
| 2014/0147079 A1 | 5/2014 | Doerr et al. | |
| 2014/0153601 A1 | 6/2014 | Doerr et al. | |
| 2014/0203175 A1 | 7/2014 | Kobrinsky et al. | |
| 2014/0264907 A1 | 9/2014 | Altunyurt et al. | |
| 2014/0286647 A1 | 9/2014 | Ayazi et al. | |
| 2014/0308006 A1* | 10/2014 | Beausoleil | G02B 6/29304 385/37 |
| 2015/0063747 A1 | 3/2015 | Chen et al. | |

FOREIGN PATENT DOCUMENTS

| | | | |
|---|---|---|---|
| JP | 2000091675 A | * | 3/2000 |
| JP | 2000292642 A | * | 10/2000 |
| JP | 3688131 B2 | * | 8/2005 |
| JP | 2012252135 | | 12/2012 |
| WO | WO 96/10265 A1 | | 4/1996 |

OTHER PUBLICATIONS

Galan et al., Low profile silicon photonics packaging approach featuring configurable multiple electrical and optical connectivity. Proceedings of the 8th IEEE International Conference on Group IV Photonics (GFP). Sep. 14-16, 2011:377-9.

Kopp et al., Silicon Photonic Circuits: On-CMOS Integration, Fiber Optical Coupling, and Packaging. IEEE J Sel Top Quant Electron. May/Jun. 2011;17(3):498-509.

Thacker et al., Flip-Chip Integrated Silicon Photonic Bridge Chips for Sub-Picojoule Per Bit Optical Links. 2010 Electronic Components and Technology Conference. 2010:240-6.

Zheng et al., Low power silicon photonic transceivers. Photonics Society Summer Topical Meeting Series, 2010 IEEE. Jul. 19-21, 2010;199-200.

International Search Report and Written Opinion dated Mar. 17, 2016 for Application No. PCT/US2015/058070.

[No Author Listed], Light On Board™ Optically Enabled BGA IC Package. Reflex Photonics. White Paper. 15 pages.

Barwicz et al., Assembly of Mechanically Compliant Interfaces between Optical Fibers and Nanophotonic Chips. The 64$^{th}$ Electronic Components and Technology Conference (ECIC 2014). Orlando, Florida. Presentation. May 27-30, 2014. 14 pages.

Maj et al., Light On Board Technology Overview™; Implementation of High-Speed Optical Interconnects Integrated into Semiconductor Integrated Circuit (IC) Packages. Reflex Photonics, Inc. White Paper. Apr. 2006. 4 pages.

* cited by examiner

OPTOELECTRONIC BALL GRID ARRAY PACKAGE WITH FIBER

RELATED APPLICATIONS

This Application is a divisional application of U.S. patent application Ser. No. 14/927,016 filed on Oct. 29, 2015, which claims priority to and the benefit under 35 U.S.C. § 119(e) to U.S. Provisional Patent Application Ser. No. 62/069,877, filed Oct. 29, 2014 and entitled "OPTOELECTRONIC BALL GRID ARRAY PACKAGE WITH COILED FIBER," the entire disclosures of each of which are incorporated by reference herein in their entirety.

BACKGROUND

Field

The present application relates to packaging electronic components having one or more optical fiber connections.

Related Art

Photonic integrated circuits (PICs) include optical components fabricated on a silicon substrate. Often an optical fiber is coupled to the PIC to deliver optic signals to and from the PIC. The optical fiber can be edge-coupled to the PIC, or coupled to a surface of the PIC.

BRIEF SUMMARY

According to an aspect of the application, an apparatus is provided, comprising a substrate having a first surface, a photonic integrated circuit (PIC) coupled to the substrate and having a first surface proximate the first surface of the substrate and a second surface opposite the first surface of the PIC and distal the first surface of the substrate, a lid, contacting the first surface of the substrate, and a fiber holder disposed on the lid. The apparatus further comprises an optical fiber coupled to the PIC and in contact with the fiber holder.

According to an aspect of the application, a method is provided, comprising packaging a photonic integrated circuit (PIC) in a package comprising a substrate and a lid, mounting a fiber holder on the lid of the package such that the lid is between the PIC and the fiber holder, coupling an optical fiber to the PIC and mechanically coupling the optical fiber to the fiber holder.

According to an aspect of the application, an apparatus is provided, comprising a substrate having a first surface, a photonic integrated circuit (PIC) coupled to the substrate and having a first surface proximate the first surface of the substrate and a second surface opposite the first surface of the PIC and distal the first surface of the substrate and a lid, contacting the first surface of the substrate and at least partially covering the PIC, exhibiting at least one retaining feature. The apparatus further comprises an optical fiber coupled to the PIC and in contact with the retaining feature of the lid.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION OF INVENTION

Figure 1:
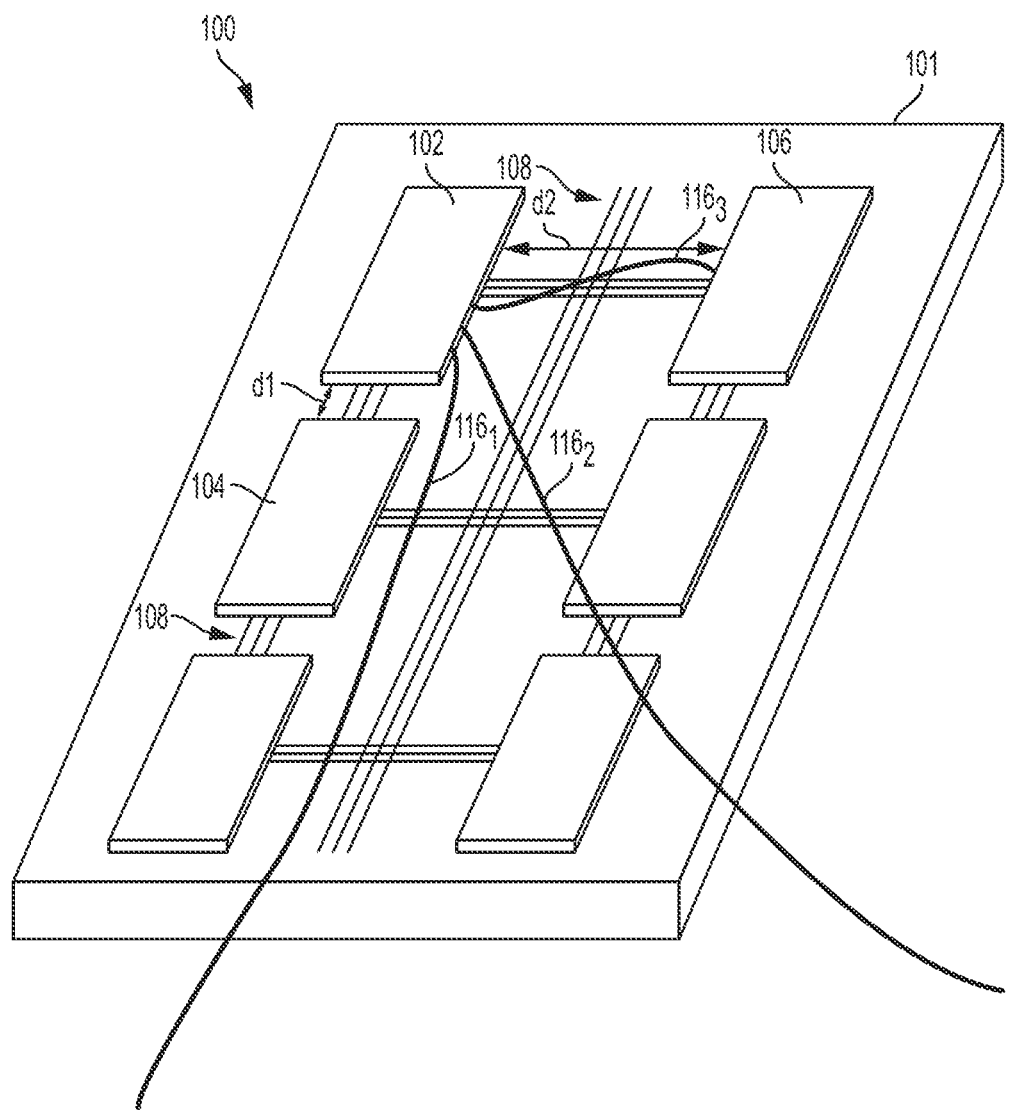
FIG. 1 illustrates a printed circuit board (PCB) on which a number of photonic integrated circuits (PICs) and a number of electronic integrated circuits (EICs) are surface mounted, according to a non-limiting embodiment of the present application.

Applicant has appreciated that conventional techniques for packaging PICs are not practical when it is desired to co-package a PIC and electrical circuitry operating in connection with the PIC, such as drivers and/or application specific integrated circuits (ASICs). This may be particularly true when it is desired to have an optical fiber coupled to the PIC in a permanent manner, as opposed to with a pluggable connection. ASICs and drivers may be packaged in ball grid array (BGA) packages, and such packages can be surface mounted on printed circuit boards (PCBs). Yet, doing so typically involves performing solder reflow, by placing the PCB and any components to be mounted thereon in an oven. The components are exposed to temperatures sufficiently high to achieve the desired solder reflow. Moreover, it may be desirable to mount many components on a PCB, providing only small gaps between components. Any optical fibers associated with a PIC may make close spacing of components on a PCB difficult. The fibers may catch on other components being placed on the PCB, and may be broken off during the placement of the packaged PIC or when passing through the oven. Moreover, the component is usually picked from a waffle pack and placed onto the PCB by a high-speed machine. Having fibers dangling from the component would make this impractical. Moreover, the temperatures experienced in the oven during the solder reflow process may damage the optical fibers, for instance by damaging any coating on the fibers. Thus, co-packaging a PIC with electronic circuitry in a package compatible with solder reflow processes may be difficult.

Therefore, aspects of the application provide apparatus and methods for retaining, during a reflow soldering process, an optical fiber coupled to a packaged PIC. By suitably retaining the optical fiber, the PIC may be packaged in a type of package capable of being mounted on a PCB and subjected to solder reflow, such that the PIC may in some embodiments be co-packaged with an ASIC, drivers, or other electronic circuitry. One such type of package is a BGA package. The optical fiber may be retained in a manner allowing the package containing the PIC to be placed in close proximity to other components on a PCB, and may also prevent the optical fiber from being subjected to temperatures sufficiently high to damage the fiber.

According to an aspect of the application a PIC is mounted in a package comprising a substrate and a lid. A fiber holder may be disposed on the package, for example on the lid. An optical fiber may be mechanically coupled to the fiber holder, for example by being wound or coiled around the fiber holder. The fiber holder may be attached to the lid during packaging of the PIC, to retain the optical fiber, and may be removed after completion of a solder reflow process involved in mounting the packaged PIC to a PCB or other substrate. Thus, in some embodiments, the fiber holder may be temporary. The PIC may be co-packaged with an ASIC and/or driver circuitry in some embodiments.

According to an aspect of the application a method for surface mounting a PIC on a PCB is provided. The method may comprise attaching a fiber holder to a packaged PIC, attaching to the fiber holder an optical fiber that is coupled to the PIC, exposing the package to a solder reflow process to mount the packaged PIC on a PCB, removing the optical fiber from the fiber holder, and removing the fiber holder from the packaged PIC. The optical fiber, temporarily attached to the fiber holder, may be retained in a manner so as to prevent it from catching on other components mounted on the PCB. The optical fiber may be permanently coupled to the PIC in some embodiments.

According to an aspect of the application, a PIC coupled to an optical fiber is in a package including a substrate and a lid. The lid includes a fiber retaining feature. The optical fiber coupled to the PIC is engaged with the fiber retaining feature of the lid, at least during a solder reflow process performed on the packaged PIC. In some embodiments, the fiber retaining feature is a groove and the optical fiber may be coiled around the groove. In some embodiments, the package is a BGA package, and the package may include an ASIC or a driver circuit in addition to the PIC.

Various aspects will be described herein as including a "fiber holder." Alternative terminology may be used herein, including "fiber block," "fiber retainer," and "fiber support," as non-limiting examples.

Various aspects will be described herein as including a "strength." Alternative terminology may be used herein, including "amplitude," "power," and "magnitude," as non-limiting examples.

The aspects and embodiments described above, as well as additional aspects and embodiments, are described further below. These aspects and/or embodiments may be used individually, all together, or in any combination of two or more, as the application is not limited in this respect.

As described, aspects of the present application relate to a packaged PIC which is coupled to an optical fiber and which may be mounted on a chip carrier, such as a PCB, together with other components. FIG. 1 illustrates an apparatus 100 including a printed circuit board (PCB) 101 according to an aspect of the present application. PCB 101 may comprise one or more PICs, electronic integrated circuits (EICs), and/or laser chips. For example, as illustrated, a PIC 102, EIC 104, and laser chip 106 may be mounted on the PCB 101. The PIC 102 is coupled to one or more optical fibers to route optical signals into or out of the PIC. In the non-limiting example illustrated, the PIC 102 is coupled to three optical fibers 1161, 1162, and 1163, although at least some aspects of the present application apply to a packaged PIC with one or more coupled optical fibers. The components mounted on the PCB 101 may optionally be electrically interconnected via electrical traces 108 of any suitable kind, such as copper traces.

The PIC 102 may comprise photonic circuitry to generate, modulate, detect or process light in any suitable fashion. For example, the PIC 102 may be a transceiver for optical communications. The various aspects described herein are not limited to the particular type of PIC included. FIG. 1 shows the optical fibers 1161, 1162, and 1163 as being edge coupled to the PIC 102. However, in some embodiments, the optical fiber(s) may be vertically coupled to the packaged PIC, for example through optical gratings.

The EIC 104 may comprise electronic circuitry to process digital and/or analog signals. In some embodiments the EIC 104 may comprise modulator drivers, trans-impedance amplifiers or clock recovery circuits. In some embodiments, the EIC 104 may be an application-specific integrated circuit (ASIC), a field programmable gate array (FPGA), system on a chip (SoC) or a microcontroller, and may include any combination of logic units, volatile and non-volatile memory units, RF transceivers, analog-to-digital converters and digital-to-analog converters.

In some embodiments, EIC 104 may disposed next to and in electric communication with packaged PIC 102, as illustrated. However, as will be described further below, for example in connection with FIGS. 2A-2D, aspects of the present application allow for co-packaging of PICs with EICs. That is, embodiments of the present application allow for PIC 102 and EIC 104 to be co-packaged, for example in a BGA package, either directly on a BGA substrate or on an interposer on the BGA substrate. Such co-packaging may be facilitated by aspects of the present application providing a manner for supporting the optical fibers 1161, 1162, and 1163 during a solder reflow process.

The optical fibers of the apparatus 100 may be coupled to components external to the PCB 101 or to components on the PCB 101, or to a combination of both. For example, optical fibers 1161 and 1162 may be connected to optical components not mounted on PCB 101 (not shown). Optical fiber 1163 may be connected and optically coupled to laser chip 106. Laser chip 106 may comprise distributed feedback lasers (DFBs), distributed Bragg reflector lasers (DBRs), rings lasers, vertical-cavity surface-emitting lasers (VCSELs), quantum well lasers, quantum cascaded lasers, or any other suitable semiconductor laser. For example, if the PIC 102 represents an optical transceiver, the laser chip 106 may provide an input signal to the optical transceiver via the optical fiber 1163. Laser chip 106 may further comprise a thermo-electric cooler to stabilize the operating temperature.

Components on a PCB are typically positioned near each other, to conserve space. For example, it may be desirable for the distances d1 and d2 between adjacent components on PCB 101 to be less than 30 cm, less than 1 cm, less than 1 mm, less than 100 µm, between 100 µm and 2 mm, or any value or range of values within such ranges. Consequently, assembling the components on the PCB can be technologically challenging, especially in the presence of optical fibers dangling around the board. For example, the optical fibers 1161 and 1162 may make it difficult to position EIC 104 in close proximity to the PIC 102. It is also difficult for a high-speed pick-and-place machine to handle components with dangling fibers.

According to an aspect of the present application, a fiber holder is provided with the packaged PIC 102 to support the optical fibers, at least during mounting processes such as solder reflow and placement of the PIC 102 or other components on the PCB 101. A non-limiting example of a packaged PIC including a fiber holder is described in connection with FIG. 2A.

Figure 2A:
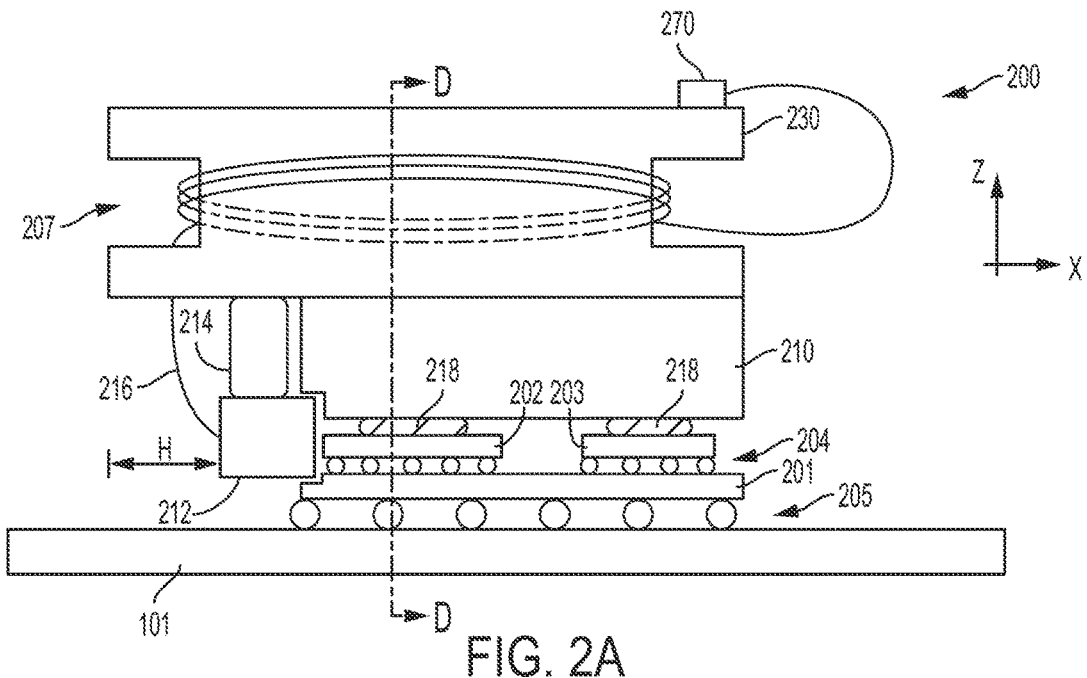
FIG. 2A is a side view of a package comprising a PIC, a fiber holder and a fiber coupled to the fiber holder, according to a non-limiting embodiment of the present application.

FIG. 2A illustrates a cross-sectional view of an apparatus 200 representing a co-packaged PIC and EIC with a fiber holder to support an optical fiber coupled to the PIC. Apparatus 200 may therefore serve as PIC 102 of FIG. 1 in a non-limiting embodiment.

The apparatus 200 includes PIC 202 and EIC 203 coupled to a substrate 201 and mounted on the PCB 101. The PIC 202 may be in electric communication with the EIC 203 through electrical connections 204, such as vias, metal pillars, solder bumps, conductive traces patterned in the substrate 201, or any other suitable electrical connections. A lid 210 covers the PIC 202 and EIC 203, and may dissipate heat generated by the two chips. The package may further comprise a fiber assembly 212 connected to an optical fiber 216, which may be a single mode optical fiber (SMF) or any other type of optical fiber. While FIG. 2A shows one optical fiber 216 connected to fiber assembly 212, fiber assembly 212 may alternatively be connected to a plurality of optical fibers. The package may further include, at least temporarily, a fiber holder 230 configured to retain optical fiber 216. The package may be surface mounted on PCB 101 via a ball grid array (BGA) 205 of solder balls, or via other suitable electrical connection.

In some non-limiting embodiments, fiber assembly 212 is mounted in the package so as to enable optical access to the PIC through optical fiber 216. The coupling of optical fiber 216 to the PIC 202 may be permanent, rather than pluggable. Thus, in at least some embodiments, it may not be possible to remove the optical fiber 216 from the PIC 202 for the solder reflow process. Optical fiber 216 may be arranged in fiber assembly 212 in any suitable manner. For example, fiber assembly 212 may comprise V-shaped or U-shaped grooves. Optical fiber 216 may be disposed in any of such grooves. While coupling optical fibers to optical waveguides has very low tolerance to misalignments (typically +/−0.5 um), the use of grooves allows for high-precision positioning of the fiber with respect to the PIC, thus minimizing insertion loss. While FIG. 2A shows PIC 202 as being coupled to one optical fiber, more than one optical fiber may be coupled to PIC 202.

The fiber holder 230 may be used to support the optical fiber 216 during certain steps of manufacturing, such as during placement of the packaged PIC 202 and EIC 203 on the PCB 101 and/or solder reflow for affixing the substrate 201 to the PCB 101. Fiber holder 230 may be disposed on top of the package. For example, it may be attached to lid 210 and secured via one or more screws, threaded rods, or other fastening mechanism suitable to withstand the temperatures of solder reflow. Alternatively, fiber holder 230 may be secured to the lid 210 via a snap-fit or press-fit or magnetic connection.

The fiber holder 230 may perform multiple functions. Firstly, it prevents loose portions of optical fiber 216 from dangling around PCB 101 during the surface-mounting phase. Dangling fibers may accidently snap or snag on other components of the PCB 101 and may consequently cause impairments to the operation of the PIC 202, the apparatus 200, and the PCB 101 more generally. Accordingly, the fiber holder 230 may include one or more fiber retaining features. Non-limiting examples of such fiber retaining features include a groove, channel, fiber path, opening, or combination of those features. In the illustrated example, the fiber holder 230 includes a groove 207 representing a narrower central region of the fiber holder. By winding or coiling optical fiber 216 around fiber holder 230, as shown, the potential negative consequences of having optical fiber 216 dangle loosely are avoided.

Figure 2B:
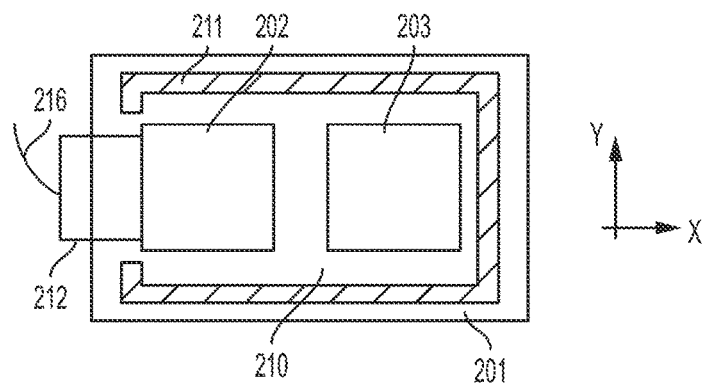
FIG. 2B is a top view of the package of FIG. 2A, according to a non-limiting embodiment of the present application.
Figure 2C:
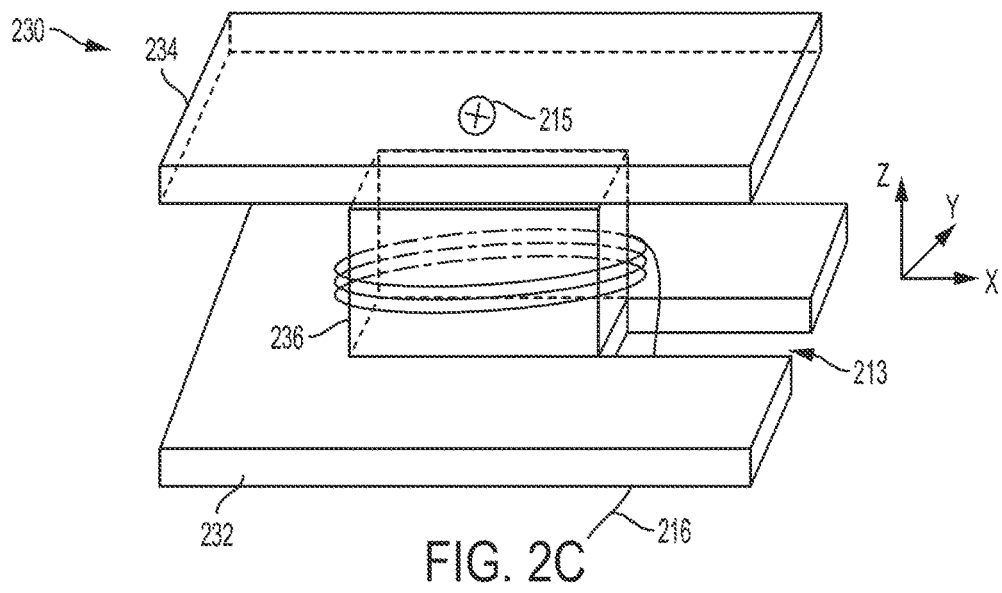
FIG. 2C is a perspective view of the fiber holder shown in FIG. 2A, according to a non-limiting embodiment of the present application.
Figure 2D:
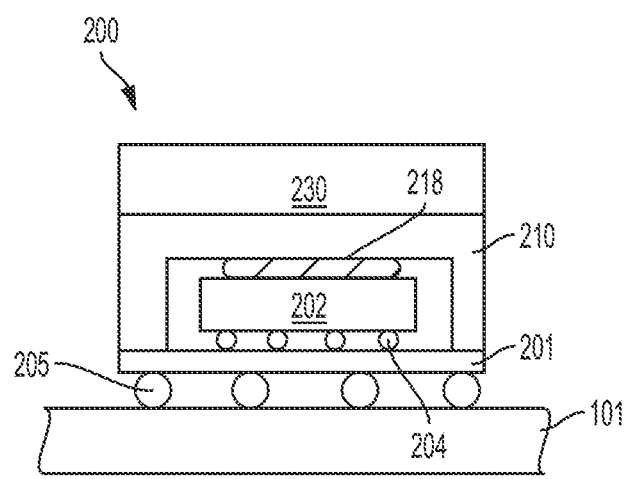
FIG. 2D is a view of the apparatus of FIG. 2A taken along line D-D.

FIG. 2C shows a perspective view of the fiber holder 230. As shown, the fiber holder 230 comprises a bottom plate 232, a top plate 234 and a pillar 236. The fiber holder 230 may be a spool. The pillar 236 may define a narrower region than the bottom plate 232 and top plate 234, and may serve as a feature around which optical fiber 216 may be wound, as illustrated. The optical fiber may be wound by hand or in an automated manner using suitable machinery. While in the figure pillar 236 exhibits a rectangular cross-section, any suitable cross-sectional shape may be used. Optical fiber 216 may be coiled around pillar 236 through an opening 213 provided in bottom plate 232. The opening 213 may allow for the optical fiber 216 to be wound around the fiber holder 230 without requiring the optical fiber 216 to extend as far from its connection to the PIC 202 at the fiber assembly 212.

When the optical fiber 216 is wound or coiled about the fiber holder 230, it may be done with a radius smaller than the minimum bend radius that causes optical losses. This is because the optical fiber 216 is being coupled to the fiber holder 230 for purposes of mounting the packaged PIC on the PCB 101 through a solder reflow process, during which the optical fiber 216 will not be in use. Subsequent to completing the mounting process, the optical fiber 216 may be removed from the fiber holder 230 and allowed to assume a configuration which does not impart to the optical fiber 216 a bend radius smaller than that which causes optical losses. In some embodiments, optical fiber 216 is coiled around fiber holder 230 with a bend radius between approximately 1 mm and 1 cm, between approximately 3 mm and 10 cm, between approximately 5 mm and 5 cm, or any other value or range of values within such ranges. The pillar 236 may have cross-sectional dimensions giving rise to the bend radius of the coiled optical fiber 216 within any of the ranges listed, as non-limiting examples.

In the non-limiting embodiment shown in FIGS. 2A and 2C, the optical fiber may be coiled around an axis that is substantially perpendicular to the top surface of PIC 202, meaning that the optical fiber may be coiled within a plane substantially parallel to a plane of the PIC 202. However, as will be described further below in connection with FIGS. 4A-4B, other suitable configurations exhibiting coiling axes not perpendicular the top surface of the PIC are also possible.

Moreover, although FIGS. 2A and 2C illustrate the optical fiber 216 being wound around the fiber holder 230, not all embodiments are limited in this respect. For example, the optical fiber 216 may be positioned in a zig-zag pattern, back-and-forth pattern, or other suitable configuration with respect to a fiber holder. Thus, coiling or winding the optical fiber around a fiber holder represents a non-limiting example of a manner of coupling the two.

Referring still to FIG. 2C, the fiber holder 230 may include a hole 215 configured to receive or accommodate a coupler to couple the fiber holder 230 to the lid 210. For example, hole 215 may accommodate a screw. Other features may additionally or alternatively be provided to allow for temporarily coupling the fiber holder 230 to the lid 210.

Referring again to FIG. 2A, while one end of optical fiber 216 is coupled to PIC 202 at the fiber assembly 212, the other end may be secured to fiber holder 230 through a fiber clip 270 or any other suitable securing mechanism, thus keeping fiber 216 from moving after it is coupled to the fiber holder 230. Fiber clip 270 may alternatively be placed on any other suitable component of apparatus 200. As will be described further below in connection with FIG. 6, the end of the optical fiber not coupled to the PIC 202 may eventually be coupled to another component on the PCB or to a component external to the PCB. Thus, it should be appreciated that in at least some embodiments the fiber holder 230 retains or supports a portion of the optical fiber not including the ends of the optical fiber. For example, a central or middle portion of the length of the optical fiber may be retained by the fiber holder 230.

A second function performed by the fiber holder 230 may be to keep optical fiber 216 at a low temperature during the reflow soldering. Typical soldering reflow may reach temperatures of 260° C. or higher, which may damage the optical fiber's protective jacket. In some embodiments, fiber holder 230 is made of a material exhibiting high thermal mass and high thermal conductivity so as to slowly respond to increases in temperature while absorbing heat from optical fiber 216. In some embodiments, fiber holder 230 is made of copper or aluminum. Fiber holder 230 may also have a shiny surface to further reflect heat. To further facilitate temperature control of the optical fiber 216 as well as the fiber assembly 212, a thermal pad 214 may be disposed between and in contact with fiber assembly 212 and fiber holder 230. Thermal pad 214 may keep fiber assembly cool during reflow soldering. The thermal pad 214 may be of any suitable material, such as paraffin wax or silicone.

A third function performed by the fiber holder 230 is that it may laterally extend beyond the edge of the lid 210 in the x-direction of FIG. 2A, acting as a cover or overhang for the fiber assembly 212 as shown in FIG. 2A. By covering fiber assembly 212, fiber holder 230 may provide mechanical protection against potential collisions with other components that may occur throughout the surface mounting process. The amount of overhang H may be between 0.5 mm and 1mm, or any other suitable amount.

PIC 202 may be fabricated on a silicon-on-insulator (SOI) wafer, a bulk silicon wafer, an indium phosphide wafer or any other suitable semiconductor wafer. In some embodiments, substrate 201 is made of ceramic. In other embodiments substrate 201 is made of an organic material. In some embodiments, lid 210 is used as a heat sink to dissipate heat generated by the PIC 202 and EIC 203. The lid 210 may be formed of a material exhibiting a high thermal conductivity, such as aluminum or copper. A thermal pad or thermal paste 218 may be disposed between PIC 202 and lid 210, and between EIC 203 and lid 210 to ensure efficient heat transfer to the lid. The lid 210 may further comprise fins to transfer heat out of the package (not shown).

FIG. 2B shows a top view of the package including substrate 201, PIC 202, EIC 203, fiber assembly 212, optical fiber 216 and lid 210. In some embodiments lid 210 may comprise a top surface (shown as shaded) and an outer wall 211 (shown as solid). The lid's outer wall 211 may be placed in contact with substrate 201. While the lid's outer wall 211 may surround the two chips, an opening may be provided to enable access to PIC 202 through fiber assembly 212 as shown in FIG. 2B. This can also be seen by reference to FIG. 2D, which is taken along line D-D of FIG. 2A. As shown, the lid 210 contacts the substrate 201, but access is provided to PIC 202.

To efficiently couple optical signals between optical fiber 216 and PIC 202, fiber assembly 212 may be positioned as close to PIC 202 as possible. Accordingly, as shown in FIG. 2A, a portion of an edge of lid 210 and a portion of an edge of substrate 201 may be partially etched so as to accommodate fiber assembly 212.

In some non-limiting embodiments, PIC 202 may be flip-chip mounted on substrate 201. Accordingly, the handle of the PIC 202 faces lid 210 and the planar photonic circuitry faces substrate 201. However, PIC 202 may alternatively be mounted on substrate 202 without being flipped. In such a configuration, one or more optical fibers may be optically coupled to the top surface of the PIC through optical gratings. The optical fibers may be further coupled to fiber holder 230.

Figure 3:
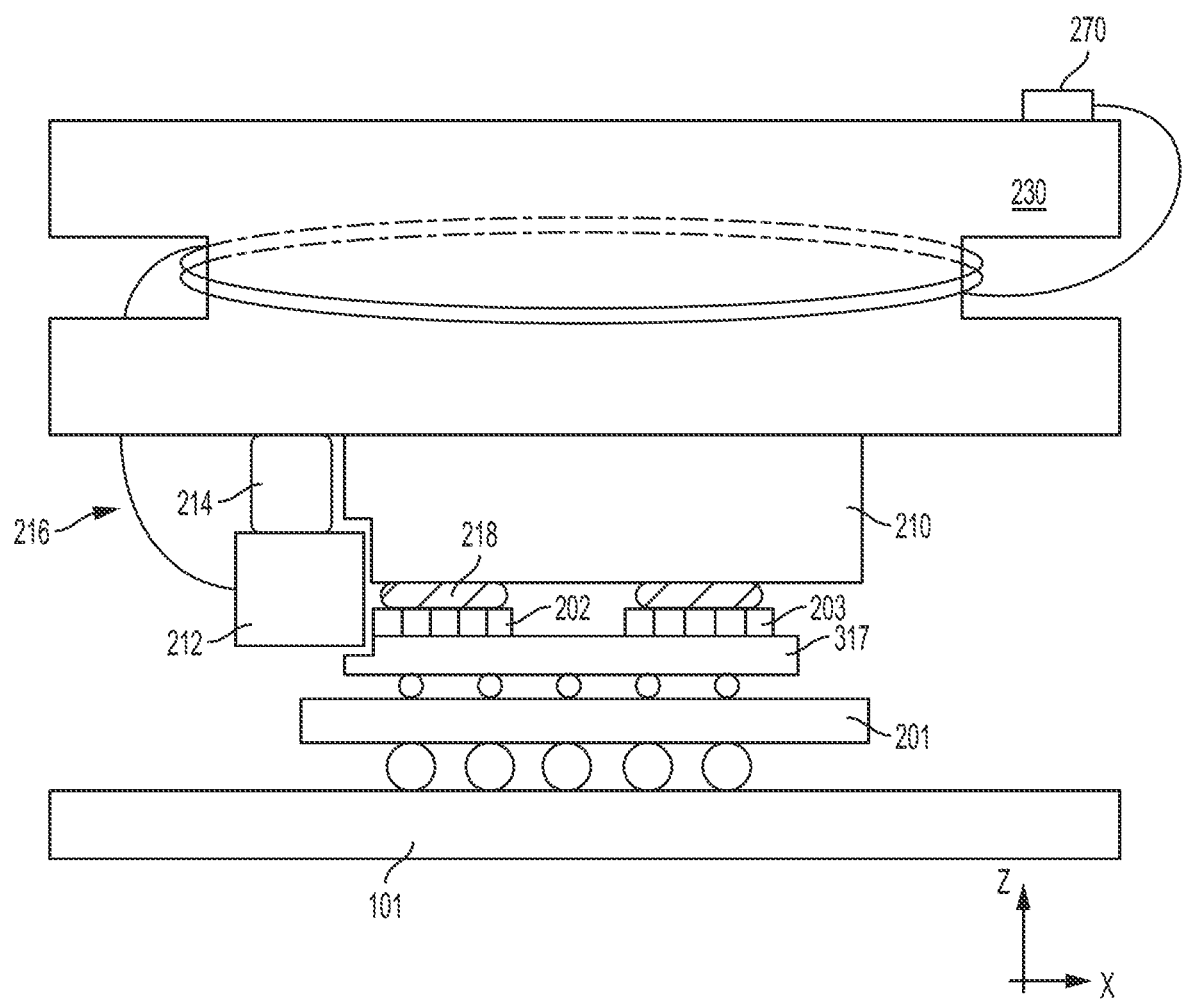
FIG. 3 illustrates an alternative to the package illustrated in FIG. 2A in which the packaged PIC is disposed on an interposer, according to a non-limiting embodiment of the present application.

In some embodiments, an interposer may be used to route electrical signals between PIC 202 and EIC 203. Interposers may be used to maximize the connection density of the electric path between PIC 202 and EIC 203. FIG. 3 illustrates an alternative embodiment comprising an interposer 317. In the non-limiting example shown in FIG. 3, interposer 317 is disposed on substrate 201, making electrical contact with it through metal pillars or solder bumps. Electric connection between interposer 317 and PIC 202 may be achieved with through silicon vias (TSV). TSVs may exhibit electric capacitances order of magnitudes lower than those associated with metal pillars or solder bumps. For instance the capacitance associated to the TSVs shown in FIG. 3 may be less than 1 pF, less than 100 fF, or less than 1 fF, as non-limiting examples. Similarly, electric connection between interposer 317 and EIC 203 may be achieved with TSVs. However, any other suitable form of electric connection may be used. Due to the low electric capacitance, the resulting bandwidth of the electric path connecting PIC 202 to EIC 203 is substantially higher than that of a path where an interposer is not used. In some embodiments, such bandwidth may be greater than 1 GHz, greater than 10 GHZ, greater than 40 GHz, between and 30 GHz, or any value or range of values within such ranges.

The other components in FIG. 3 have already been described and remain the same as previously described.

Figure 4A:
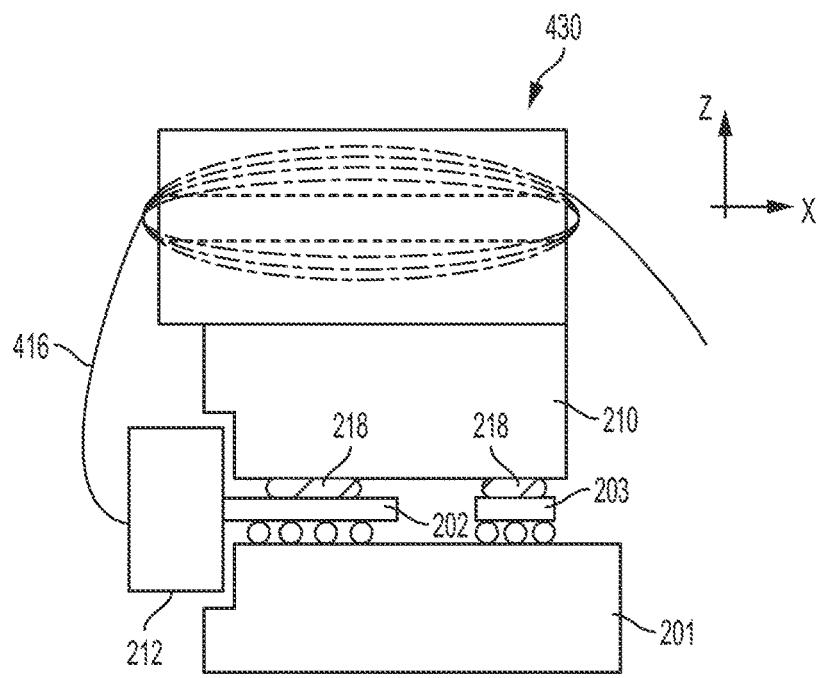
FIG. 4A is a side view of an alternative to the package illustrated in FIG. 2A in which a fiber is coiled around a plane of the fiber holder that is not parallel to the top surface of the PIC, according to a non-limiting embodiment of the present application.
Figure 4B:
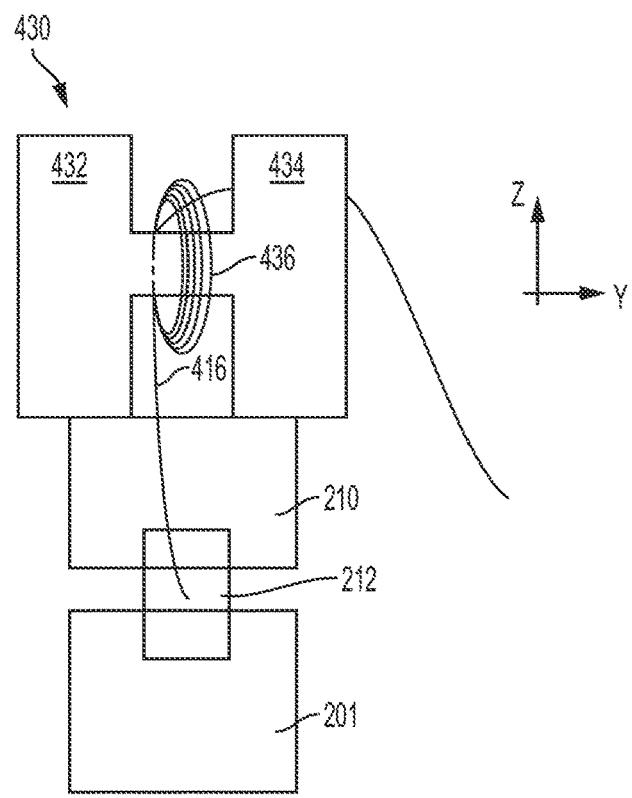
FIG. 4B is a front view of the package of FIG. 4A, according to a non-limiting embodiment of the present application.

FIG. 4A and FIG. 4B illustrate a side view and a front view, respectively, of an alternative embodiment in which an optical fiber 416 is coiled around an axis of a fiber holder that is substantially parallel the top surface of PIC 202, such that the optical fiber is coiled in a plane that is not parallel the top surface of PIC 202. As shown in FIG. 4B, fiber holder 430 may comprise pillars 432 and 434, each pillar resting on lid 210 and connected to each other through beam 436. Optical fiber 416 may be connected to fiber assembly 212 at one of its two ends and may further be coiled around beam 436. The second end of optical fiber 416 may be secured to fiber holder 430 (not shown in this figure) though any suitable securing mechanism, such as a clip of the type previously described in connection with FIG. 2A. Fiber holder 430 may be attached to lid 210 in any of the manners previously described in connection with fiber holder 230.

Figure 5:
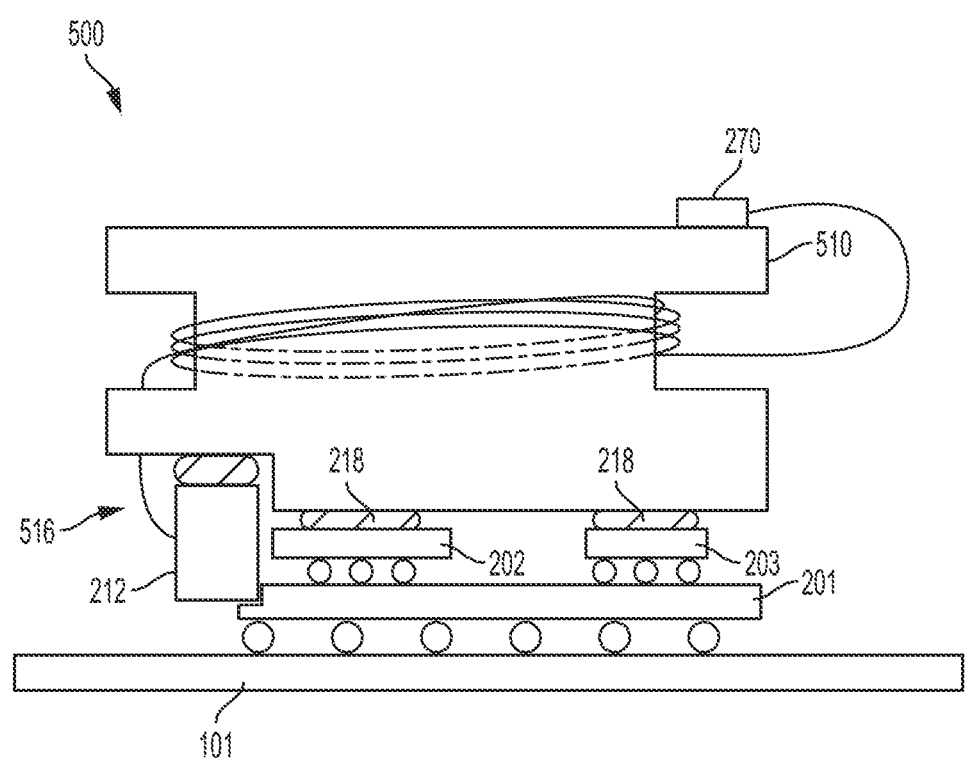
FIG. 5 is a side view of a packaged PIC in which the package is configured as a fiber holder to support an optical fiber, according to a non-limiting embodiment of the present application.

FIG. 5 illustrates an apparatus 500 according to an alternative embodiment, in which the lid of the package may serve as the fiber holder. In the non-limiting example, lid 510 may be configured to retain optical fiber 516. Namely, the lid 510 may have a shape substantially like that of fiber holder 230 of FIG. 2A, previously described. In the non-limiting embodiment shown in FIG. 5, optical fiber 516 is coiled around an axis that is substantially perpendicular to the top surface of PIC 202. However, other configurations in which optical fiber 516 is coiled around an axis not perpendicular to the top surface of PIC 202 may be used. For example, a configuration similar to that shown in FIG. 4B may be employed.

In some embodiments, lid 510 may be temporarily mounted on the package to facilitate surface mounting operations on PCB 101. For example, the lid 510 may be added prior to performing a solder reflow process involving the apparatus 500, and removed after completion of the solder reflow process. In other embodiments, lid 510 may be permanently mounted on the package. In such situations, the optical fiber 516 may be coiled around the lid 510 during surface mounting procedures, including solder reflow, but may be removed from the lid 510 thereafter. Lid 510 may be made of a material exhibiting high thermal mass and high thermal conductivity so as to slowly respond to increases in temperature while absorbing heat from optical fiber 516. In some embodiments, lid 510 is made of copper. Lid 510 may also be coated with silver to further reflect heat.

Figure 6:
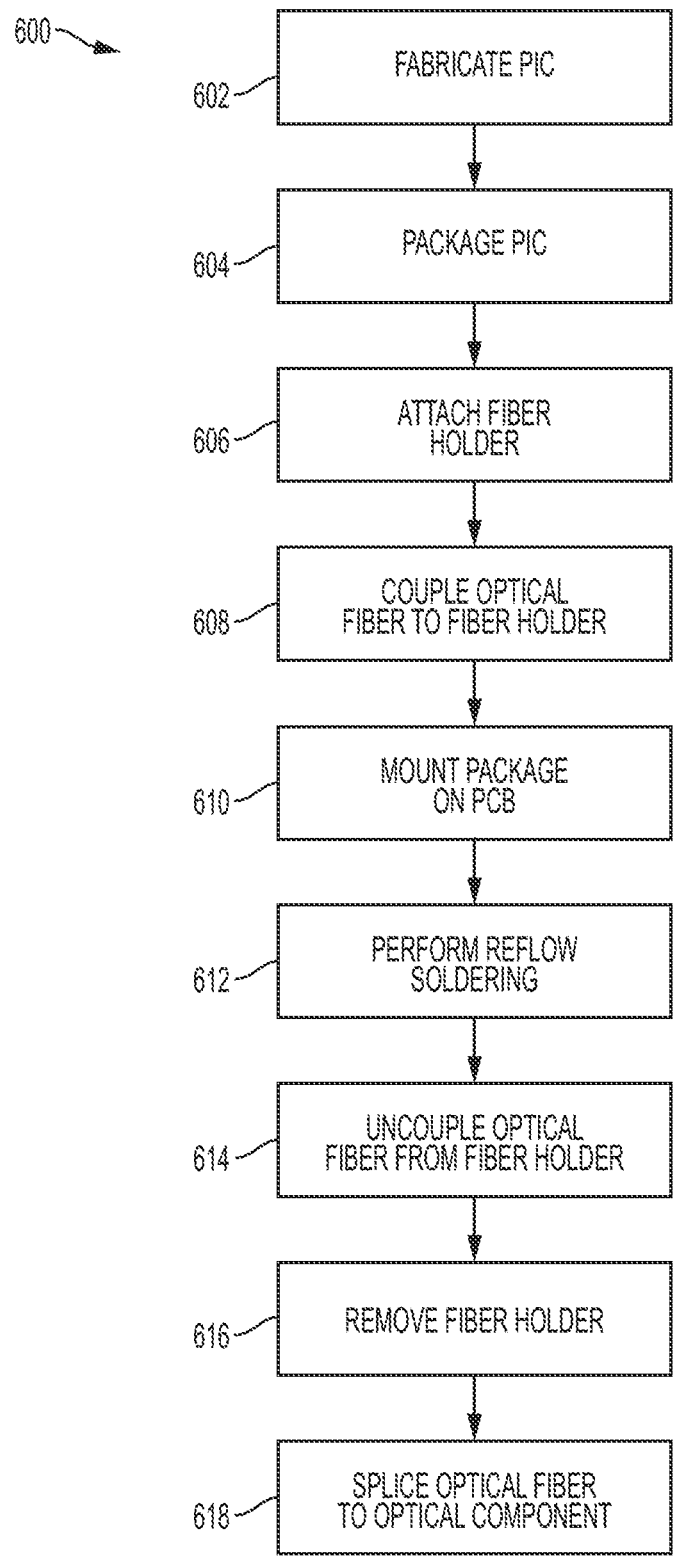
FIG. 6 illustrates the steps of a method to surface mount a packaged PIC on a PCB, according to a non-limiting embodiment of the present application.

FIG. 6 illustrates the steps of a method for surface mounting a packaged PIC on a PCB, according to an aspect of the present application. Method 600 may be used in connection with the apparatus 200 of FIG. 2A, as an example, and therefore reference to the apparatus 200 is made in describing the method. However, the described method may also apply to the apparatus of FIGS. 4A-4B. Moreover, alternative methods of mounting the packaged PIC may be used.

Method 600 begins at step 602, where PIC 202 is fabricated. PIC 202 may be fabricated in a semiconductor foundry or in any suitable fabrication facility, as the various aspects of the present application are not limited in this respect. PIC 202 may be fabricated on SOI wafers. PIC 202 may comprise one or more optical transceivers for optical communications, including coherent transceivers. PIC 202 may further comprise edge couplers such as spot-size converters and polarization devices such as polarization splitters and rotators.

In step 604, PIC 202 may be packaged. For example, the PIC may be packaged with substrate 201 and lid 210, and fiber assembly 212 may be connected to the PIC, as shown in FIG. 2A. As previously described, in some embodiments a PIC is co-packaged with an electronic circuit. Thus, for example, step 604 may include packaging the PIC with an electronic circuit, such as EIC 203.

In step 606, fiber holder 230 may be mounted on the package. Fiber holder 230 may be mounted in any of the manners previously described herein. For example, it may be screwed, snap-fitted or press-fitted on the package as described previously.

In step 608, optical fiber 216 may be coupled to or placed in contact with the fiber holder. For instance, optical fiber 216 may be coiled around fiber holder 230 as shown in FIG. 2C. As previously described, the optical fiber may be attached to the fiber holder by hand, or in an automated fashion, for example using suitable machinery.

In step 610, the packaged PIC may be disposed on a PCB, such as PCB 101. PCB 101 may further comprise a plurality of EICs, such as ASICs, FPGAs, SoCs, and/or driver circuits. In step 610, the end of optical fiber 216 that is not attached to fiber assembly 212 may be secured to fiber holder 230 with a clip as shown in FIG. 2A.

In step 612, PCB 101 may be exposed to a reflow soldering process to melt and permanently connect the contacts between PCB 101 and substrate 201. Throughout the reflow soldering, optical fiber 216 may be secured to fiber holder 230 so as to not be in the way of other components mounted on the PCB. In addition, by maintaining thermal contact with fiber holder 230, optical fiber 216 may be kept to a temperature low enough to prevent damage to the fiber jacket, if any. In some embodiments, the reflow may reach a temperature of 260° C. for several seconds or more, such as between 10 seconds and 30 seconds, between 10 seconds and one minute, or any other duration suitable to adhere the packaged PIC to the PCB.

In step 614, the optical fiber may be uncoupled from fiber holder. For example, in the non-limiting embodiment of FIG. 2A, optical fiber 216 may be uncoiled from fiber holder 230. In step 616, fiber holder 230 may be removed from the package.

In step 618, optical fiber 216 may be spliced to an optical component disposed on or outside PCB 101.

Again, it should be appreciated that alternatives to the method 600 may be implemented. For example, in those embodiments in which a package lid, such as lid 510 of FIG. 5 serves as the fiber holder, the lid may not be removed after the solder reflow process. Further alternatives are possible.

The aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

Aspects of the present application provide simplicity in surface mounting a packaged PIC on a PCB when it is desired to have an optical fiber coupled to the PIC in a permanent manner, as opposed to with a pluggable connection. Throughout the surface mounting process the fiber(s) may catch on other components being placed on the PCB, and may be broken off during the placement of the packaged PIC or when passing through the reflow oven. Retaining the fiber with a fiber holder mounted on the package allows the package containing the PIC to be placed in close proximity to other components on a PCB while avoiding any impairment of the fiber. Moreover, the thermal properties of the fiber holder may be selected to prevent the fiber from being subjected to temperatures sufficiently high to cause damage to the fiber.

Aspects of the present application allow for the packaged PIC with a permanent optical fiber connection to be treated much like a conventional packaged EIC for purposes of a surface mounting process. In this manner, the packaged PIC may be placed on a PCB and subjected to PCB processing in the same manner as done for EICs.

Aspects of the present application facilitate co-packaging of PICs and drivers and/or ASICs. The aspects described herein allow for PICs having permanent optical fiber connections to be packaged in BGA packages or other packages compatible with packaging EICs. Thus, a PIC and EIC may be packaged together.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A method, comprising:
    packaging a photonic integrated circuit (PIC) in a package comprising a substrate and a lid, the substrate having a first surface and a second surface opposite the first surface of the substrate, the PIC having a first surface;
    mounting a fiber holder on the lid of the package such that the lid is between the PIC and the fiber holder, wherein the first surface of the substrate is proximate the first surface of the PIC and the second surface of the substrate is distal the first surface of the PIC;
    coupling an optical fiber to the PIC, the lid contacting the first surface of the substrate and at least partially covering the PIC; and
    mechanically coupling the optical fiber to the fiber holder.

2. The method according to claim 1, further comprising surface-mounting the package on a chip carrier.

3. The method according to claim 2, further comprising securing an end of the optical fiber on the fiber holder.

4. The method according to claim 1, further comprising performing reflow soldering of the package.

5. The method according to claim 4, further comprising removing the fiber holder from the package subsequent to the reflow soldering.

6. The method according to claim 1, wherein mechanically coupling the optical fiber to the fiber holder comprises coiling a portion of the optical fiber around the fiber holder.

7. The method according to claim 6, wherein the portion of the optical fiber is coiled around the fiber holder with a radius that is less than a minimum bend radius of the optical fiber.

8. The method according to claim 1, further comprising splicing the optical fiber to an optical component.

9. The method according to claim 1, wherein mounting the fiber holder on the lid of the package comprises mounting the fiber holder with at least one screw inserted on the lid.

10. The method according to claim 1, wherein mechanically coupling the optical fiber to the fiber holder comprises coiling a portion of the optical fiber around the fiber holder.

11. The method according to claim 1, wherein the lid exhibits at least one retaining feature.

12. The method according to claim 11 further comprising contacting the at least one retaining feature of the lid with the optical fiber.

* * * * *